United States Patent

Keefe et al.

(10) Patent No.: US 9,870,927 B2
(45) Date of Patent: Jan. 16, 2018

(54) FREE-EDGE SEMICONDUCTOR CHIP BENDING

(71) Applicant: Microsoft Technology Licensing, LLC, Redmond, WA (US)

(72) Inventors: Andrew Keefe, Encino, CA (US); Geoffrey P. McKnight, Los Angeles, CA (US); Guillermo Herrera, Los Angeles, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/677,697

(22) Filed: Apr. 2, 2015

(65) Prior Publication Data

US 2016/0293429 A1 Oct. 6, 2016

(51) Int. Cl.
*H01L 31/0203* (2014.01)
*H01L 31/00* (2006.01)
(Continued)

(52) U.S. Cl.
CPC ........... *H01L 21/304* (2013.01); *H01L 23/13* (2013.01); *H01L 24/83* (2013.01); *H01L 27/14601* (2013.01); *H01L 27/14607* (2013.01); *H01L 27/14625* (2013.01); *H01L 27/14683* (2013.01); *H01L 27/14698* (2013.01); *H01L 2224/83385* (2013.01)

(58) Field of Classification Search
CPC . H01L 21/304; H01L 23/13; H01L 27/14618; H01L 27/14683; H01L 27/14601; H01L 27/14698
USPC ............... 257/618, 432, 433, 466, E23.004; 438/64, 457
See application file for complete search history.

(56) References Cited

U.S. PATENT DOCUMENTS 5,349,443 A 9/1994 Guerra
5,514,888 A 5/1996 Sano et al.
(Continued)

FOREIGN PATENT DOCUMENTS

EP 1132967 9/2001
EP 2458638 A1 5/2012
JP 2012182194 A 9/2012

OTHER PUBLICATIONS

Office action for U.S. Appl. No. 14/491,903, mailed on May 5, 2016, McKnight et al., Image Sensor Bending by Induced Substrate Swelling, 12 pages.
(Continued)

*Primary Examiner* — Fernando L Toledo
*Assistant Examiner* — Aaron Gray
(74) *Attorney, Agent, or Firm* — Drinker Biddle & Reath LLP

(57) ABSTRACT

Techniques for fabricating a semiconductor chip having a curved surface may include placing a substantially flat semiconductor chip in a recess surface of a concave mold such that corners or edges of the semiconductor chip are unconstrained or are the only portions of the semiconductor chip in physical contact with the concave mold; and bending the substantially flat semiconductor chip to form a concave shaped semiconductor chip by applying a force on the semiconductor chip toward the bottom of the recessed surface. The corners or edges of the semiconductor chip move or slide relative to the recess surface during the bending.

15 Claims, 7 Drawing Sheets

(51) Int. Cl.

| | | |
|---|---|---|
| *H01L 21/00* | (2006.01) | |
| *H01L 21/30* | (2006.01) | |
| *H01L 21/46* | (2006.01) | |
| *H01L 21/304* | (2006.01) | |
| *H01L 23/13* | (2006.01) | |
| *H01L 23/00* | (2006.01) | |
| *H01L 27/146* | (2006.01) | |

(56) References Cited

U.S. PATENT DOCUMENTS

| | | | |
|---|---|---|---|
| 6,255,025 | B1 | 7/2001 | Akutsu et al. |
| 6,285,400 | B1 | 9/2001 | Hokari |
| 6,312,959 | B1 | 11/2001 | Datskos |
| 6,451,670 | B1 | 9/2002 | Takisawa et al. |
| 6,706,448 | B1 | 3/2004 | Gole et al. |
| 6,762,510 | B2 | 7/2004 | Fock et al. |
| 6,791,072 | B1 | 9/2004 | Prabhu |
| 7,190,039 | B2 | 3/2007 | Boettiger et al. |
| 7,397,066 | B2 | 7/2008 | Oliver |
| 7,507,944 | B1 | 3/2009 | Arnzen et al. |
| 7,626,621 | B2 | 12/2009 | Ito et al. |
| 7,696,588 | B2 | 4/2010 | Boettiger et al. |
| 7,714,437 | B2 | 5/2010 | Naya |
| 7,733,397 | B2 | 6/2010 | Lu et al. |
| 7,742,090 | B2 | 6/2010 | Street et al. |
| 7,923,793 | B2 | 4/2011 | Choi et al. |
| 8,124,519 | B2 | 2/2012 | Bone |
| 8,248,499 | B2 | 8/2012 | Sutton et al. |
| 8,810,671 | B2 | 8/2014 | Winter |
| 8,836,805 | B2 | 9/2014 | Sutton et al. |
| 8,878,116 | B2 | 11/2014 | Itonaga |
| 2003/0013280 | A1 | 1/2003 | Yamanaka |
| 2004/0133275 | A1 | 7/2004 | Mansmann |
| 2004/0229071 | A1 | 11/2004 | Jankosky et al. |
| 2005/0030408 | A1 | 2/2005 | Ito et al. |
| 2005/0035514 | A1* | 2/2005 | Hillman ............... B25B 11/005 269/21 |
| 2006/0186492 | A1 | 8/2006 | Boettiger et al. |
| 2006/0275941 | A1 | 12/2006 | Oliver et al. |
| 2007/0096235 | A1 | 5/2007 | Boettiger et al. |
| 2007/0222013 | A1* | 9/2007 | Lincoln ............. H01L 27/14601 257/431 |
| 2008/0237443 | A1 | 10/2008 | Oliver et al. |
| 2009/0045510 | A1 | 2/2009 | Naya |
| 2009/0115875 | A1* | 5/2009 | Choi ................. H01L 27/14618 348/294 |
| 2009/0184954 | A1 | 7/2009 | Street |
| 2010/0025789 | A1 | 2/2010 | Imai et al. |
| 2010/0178722 | A1 | 7/2010 | de Graff et al. |
| 2011/0057284 | A1 | 3/2011 | Brodie |
| 2011/0163466 | A1 | 7/2011 | Taguchi et al. |
| 2011/0200883 | A1 | 8/2011 | Cui et al. |
| 2012/0002087 | A1 | 1/2012 | Kim |
| 2012/0147207 | A1 | 6/2012 | Itonaga |
| 2012/0159996 | A1 | 6/2012 | Sutton |
| 2012/0217606 | A1 | 8/2012 | Itonaga |
| 2012/0261551 | A1 | 10/2012 | Rogers |
| 2012/0299140 | A1 | 11/2012 | Sekine |
| 2013/0268490 | A1 | 10/2013 | Keebler et al. |
| 2013/0270662 | A1 | 10/2013 | Roy et al. |
| 2013/0312541 | A1 | 11/2013 | Majidi et al. |
| 2014/0004644 | A1 | 1/2014 | Roy et al. |
| 2014/0049683 | A1 | 2/2014 | Guenter et al. |
| 2014/0160327 | A1 | 6/2014 | Enoki et al. |
| 2015/0194585 | A1 | 7/2015 | Kim et al. |
| 2015/0334300 | A1 | 11/2015 | Gabriel et al. |
| 2016/0086987 | A1 | 3/2016 | McKnight et al. |
| 2016/0086994 | A1 | 3/2016 | Guenter |
| 2016/0240582 | A1* | 8/2016 | Yamamoto ........ H01L 27/14627 |
| 2016/0268327 | A1 | 9/2016 | Lin et al. |
| 2016/0286102 | A1 | 9/2016 | Sulfridge et al. |
| 2017/0117311 | A1 | 4/2017 | McKnight et al. |

OTHER PUBLICATIONS

Cherng et al., "Fabrication of polydimethylsiloxane microlens array on spherical surface using multi-replication process", in the Journal of Micromechanics and Microengineering, vol. 24, No. 1, 2014, 10 pages.

Clarke, Peter "Sony Curves Images Sensors & TSMC Stacks Them", retrieved on Jul. 30, 2014, available at <<http://www.eetimes.com/document.asp?doc_id=1321841>>, EE Times, Apr. 9, 2014, 2 pages.

Guvendiren et al., "Swelling-Induced Surface Patterns in Hydrogels with Gradient Crosslinking Density", in the Journal of Advanced Functional Materials, vol. 19, Iss. 19, Oct. 9, 2009, 9 pages.

Itonaga, "A Novel Curved CMOS Image Sensor Integrated with Imaging System", in the Proceedings of the Symposium on VLSI Technology (VLSI-Technology): Digest of Technical Papers, Jun. 19, 2014, 2 pages.

Iwert et al., "First results from a novel curving process for large area scientific imagers", in the Journal of International Society of Optics and Photonics, SPIE Astronomical Telescopes+, 2012, 14 pages.

Mokwa et al., "CMOS Transistors under Uniaxial Stress on Ultra-Thin Chips for Applications in Bendable Image Sensors", in the Proceedings of the 2012 8th Conference on Ph.D. Research in Microelectronics and Electronics (PRIME), Jun. 12, 2012, 4 pages.

Shao et al., "Synthesis Surface Effects on the Stress and Deformation of Film/Substrate System", in the Journal of Applied Surface Science, vol. 257, Iss. 23, Sep. 15, 2011, 6 pages.

"Sony Unveils Curved Sensor-Technology" retrieved on Jan. 23, 2015 at <<http://petapixel.com/2014/04/02/sony-unveils-curved-senor-technology/>>, 8 pages.

Tekaya et al, "Mechanical Behavior of Flexible Silicon Devices Curved in Spherical Configurations", in the Proceedings of the 14th International Conference on Thermal, Mechanical and Multi-Physics Simulation and Experiments in Microelectronics and Microsystems, Apr. 14, 2013, 7 pages.

PCT Search Report & Written Opinion for Application No. PCT/US2015/049276, mailed on Dec. 10, 2015, 13 pages.

Office action for U.S. Appl. No. 14/491,903, mailed on Feb. 17, 2016, McKnight et al., "Image Sensor Bending by Induced Substrate Swelling", 10 pages.

International Search Report & Written Opinion Received for PCT Application No. PCT/US2015/049277, Mailed Date: Nov. 26, 2015, 10 Pages.

Oifice action for U.S. Appl. No. 14/677,622, mailed on Jun. 2, 2016, Keefe et al., "Bending Semiconductor Chip in Molds Having Radially Varying Curvature", 8 pages.

PCT Search Report and Written Opinion mailed Jul. 1, 2016 for PCT Application No. PCT/US16/025453, 10 Pages.

The PCT Search Report and Written Opinion mailed Jul. 4, 2016 for PCT applicatoin No. PCT/US2016/025454, 11 pages.

The PCT Written Opinion of the International Preliminary Examining Authority mailed Aug. 4, 2016 for PCT application No. PCT/US2015/049276, 7 pages.

Office action for U.S. Appl. No. 14/677,622, mailed on Nov. 2, 2016, Keefe et al., "Bending Semiconductor Chip in Molds Having Radially Varying Curvature", 12 pages.

Office action for U.S. Appl. No. 14/677,622, mailed on Feb. 3, 2017, Keefe et al., "Bending Semiconductor Chip in Molds Having Radially Varying Curvature", 15 pages.

Rehm, "Apple patent describes use of curved image sensor to design small camera module", available at: <<https://www.dpreview.com/articles/8027168176/apple-patent-describes-use-of-curved-image-sensor-to-design-small-camera-module>>, Jan. 28, 2016, 7 pages.

Sanyal, "Sony's curved sensors may allow for simpler lenses and better images", available at: <<https://www.dpreview.com/articles/2279255612/sony-s-curved-sensors-may-allow-for-simpler-lenses-and-better-images>>, Jun. 18, 2014, 20 pages.

Office Action for U.S. Appl. No. 14/491,928, mailed on Apr. 20, 2017, Guenter, "Image Sensor Bending Using Tension", 16 pages.

The International Preliminary Report on Patentability mailed Mar. 20, 2017 for PCT application No. PCT/US2016/025454, 12 pages.

The Colombian Office Action dated Apr. 6, 2017 for Colombian patent application No. NC2017/0002554, a counterpart foreign application of U.S. Pat. No. 9,570,488, 3 pages.

(56) References Cited

OTHER PUBLICATIONS

Office Action for U.S. Appl. No. 14/491,928, dated Oct. 5, 2016, Guenter, "Image Sensor Bending Using Tension", 13 pages.
Office Action for U.S. Appl. No. 15/398,266, dated Jun. 12, 2017, McKnight, "Image Sensor Bending by Induced Substrate Swelling", 15 pages.
"Notice of Allowance Issued in U.S. Appl. No. 14/491,903", dated Sep. 28, 2016, 8 Pages.
"Final Office Action Issued in U.S. Appl. No. 14/677,622", dated Jul. 20, 2017, 13 Pages.
"International Preliminary Report on Patentability Issued in PCT Application No. PCT/US2015/049276", dated Nov. 22, 2016, 9 pages.

* cited by examiner

FREE-EDGE SEMICONDUCTOR CHIP BENDING

BACKGROUND

Optical systems are commonly used in many devices, such as cameras, telescopes, binoculars, office equipment, and scientific instruments, just to name a few examples. Performance of optical systems hinges, in part, on the design of each of the elements of the system as well as the overall design of the system, which sets forth the optical interaction among the elements.

SUMMARY

This disclosure describes techniques and architectures for bending and shaping semiconductor chips, such as photonic sensors. In particular, a photonic sensor fabricated from a flat, relatively brittle material, such as silicon or gallium nitride, for example, may be shaped after the photonic sensor is fabricated, so that the light-sensitive surface of the photonic sensor is curved to have a spherical, aspheric, or other shape.

To form a curved semiconductor chip, the semiconductor chip may be placed in a concave mold so that edges or corners of the semiconductor chip are not rigidly constrained. In some implementations, the edges or corners may be the only portions of the semiconductor chip in contact with the concave mold. The edges or corners are able to move or slide on the surface of the concave mold as the semiconductor chip is bent into the shape of the concave mold. Allowing the edges or corners to move or to slide on the surface of the concave mold during bending may lead to substantially less tension in the semiconductor chip as compared to the case where the edges or corners of the semiconductor chip are fixed or constrained in one position.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The term "techniques," for instance, may refer to fabricating equipment, control system(s), method(s), computer-readable instructions, module(s), algorithms, or hardware logic (e.g., Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs)), which may be used to perform the technique(s) as permitted by the context above and throughout the document.

BRIEF DESCRIPTION OF THE DRAWINGS

The detailed description is set forth with reference to the accompanying figures. In the figures, the left-most digit of a reference number identifies the figure in which the reference number first appears. The use of the same reference numbers in different figures indicates similar or identical items or features.

DETAILED DESCRIPTION

Overview

Figure 1:
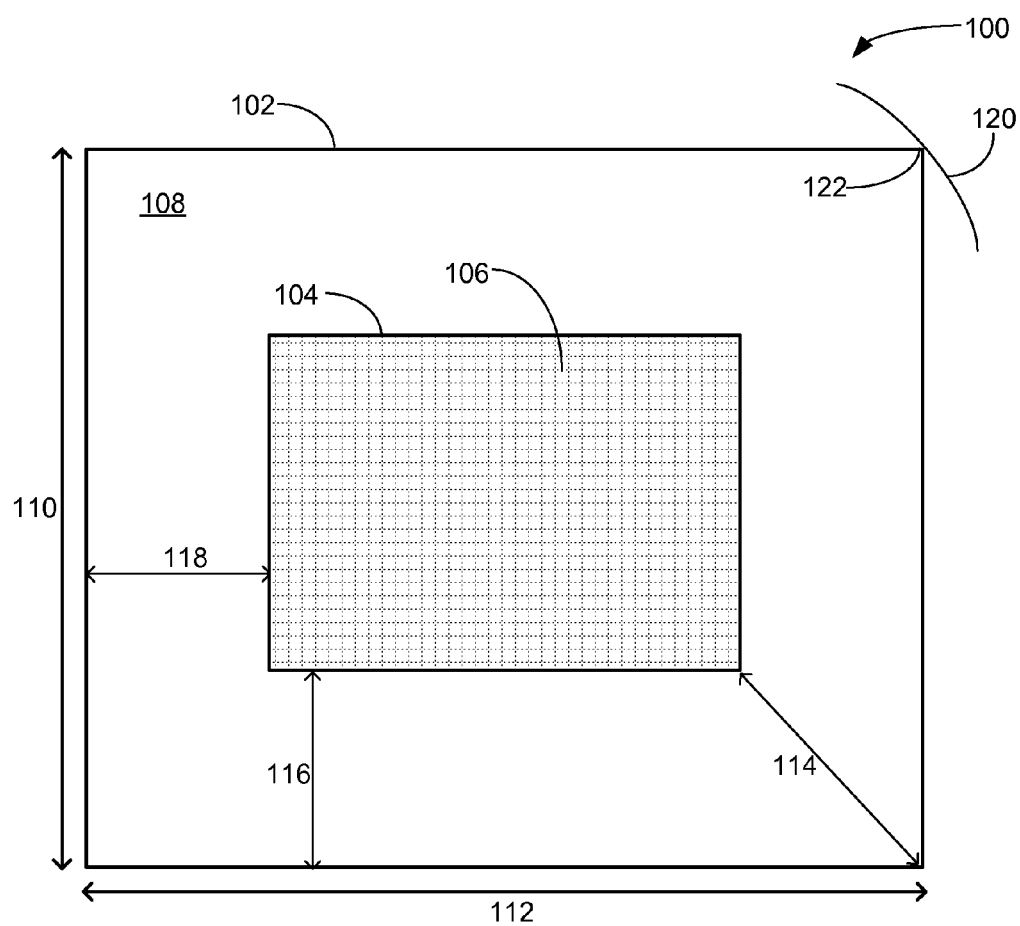
FIG. 1 is a top view of an example photonic sensor chip.

Generally, optical systems may comprise lenses, mirrors, and/or one or more light sensing devices, such as charge-coupled device (CCDs) or other devices that can convert light energy into electrical signals. A plurality of CCDs may be configured in an array (e.g. a pixelated array) fabricated on a substrate, which may be silicon, germanium, or other semiconductor material, for example. A light-sensitive device, such as a CCD, an array of CCDs, or one or more other light sensing entities in any number of configurations, fabricated on a substrate is herein called a "photonic sensor chip." This name may refer to a light sensor that need not be configured to sense an image, but rather any electromagnetic signal (visible or not).

A photonic sensor chip may be bent so that the light-sensitive surface of the photonic sensor chip has a curved shape, which may provide a number of advantages to the design of an optical system, as compared to a flat-surface photonic sensor chip. In particular, optical systems comprising lenses and/or mirrors may have fewer design constraints or improved performance characteristics when the optical systems include a curved photonic sensor chip, as compared to a flat-surface photonic sensor chip. For example, some design constraints may include number of lenses, acceptable tolerances for chromatic and/or spatial aberrations, and so on. A photonic sensor chip having a spherical, aspheric, or other surface may lead to a high performance optical system that produces a relatively uniform light intensity and spatial frequency response across the surface of the photonic sensor chip.

Herein, a semiconductor chip may include a photonic sensor chip, a substrate that includes micro-circuitry, or an unprocessed substrate. A semiconductor chip may comprise any of a number of materials, such as indium gallium arsenide, germanium, silicon, lead sulfide, indium arsenide, mercury cadmium telluride, and platinum silicide, just to name a few examples. In some examples, a process for bending a flat semiconductor chip (e.g., die) into a curved (e.g., spherical) mold allows the edges or corners of the chip to be able to slide on the surface of the mold. This is in contrast to bending processes that constrain edges or corners of a semiconductor chip to be rigidly fixed so that the edges or corners cannot move during bending. As the semiconductor chip bends under an applied force, the semiconductor chip stores mechanical energy, leading to stresses that can fracture the semiconductor chip during the bending process. By allowing edges or corners of the semiconductor chip to be able to slide on the surface of the mold, such stored stresses are reduced, which allows for greater deflections (e.g., greater bending) as compared to the case where the edges or corners are fully constrained (e.g., fixed edges). In the case of fixed edges, forming loads induce membrane tension in the semiconductor chip, reducing bending deflection, and increasing the overall internal stress state for a given deflection or radius of curvature of the semiconductor chip. For example, a 25 micron thick die may become difficult to deform beyond about 50-75 microns of center deflection due to tension-carrying loads among edge supports. In contrast, allowing the edges or corners of the die to be able to slide can lead to more than about 150 microns of center deflection.

In various examples, a semiconductor chip, such as a photonic sensor chip, may be bent in a process that includes placing the semiconductor chip on a recessed surface of a concave mold such that corners or edges of the semiconductor chip are the only portions of the semiconductor chip in physical contact with the recessed surface. Herein, a "concave mold" may include portions that are not concave. In other words, a concave mold may include portions that are not concave but instead have any of a number of other shapes (e.g., one portion of a concave mold may be convex or flat while another portion is concave). In the case where the semiconductor chip is rectangular and the recessed surface has a circular or elliptical cross section, the corners of the semiconductor chip are the only portions of the semiconductor chip in physical contact with the recessed surface. In the case where the semiconductor chip is circular and the recessed surface has a circular cross section, the edge (e.g., perimeter) of the semiconductor chip is the only portion of the semiconductor chip in physical contact with the recessed surface. In other words, the area of the circular semiconductor chip is suspended over the recessed surface of the concave mold, while the perimeter of the circular semiconductor chip rests on the recessed surface, as described below. Hereinafter, for sake of clarity, "edges" is used to indicate an edge, edges, or corners of a semiconductor chip, whether the semiconductor chip is rectangular, circular, oval, or other shape.

In various other examples, a semiconductor chip may be bent in a process that includes placing the semiconductor chip over a recessed surface of a mold such that corners or edges of the semiconductor chip are not rigidly constrained (e.g., not clamped or held in place) and are free to move as force applied to the semiconductor chip deflects the semiconductor chip. In some cases, a peripheral portion (which need not include corners or edges) of the area of the semiconductor chip may slide on the surface of the mold while a central portion (e.g., which includes an active region of the semiconductor chip) is pushed at least partially into the recessed surface of the mold. During this time, corners or edges of the semiconductor chip, not being rigidly constrained, may move in any number of directions. For example, as the central portion of the semiconductor chip is pushed downward, corners or edges may rotate upward, away from the surface of the mold and/or move inward toward the portion of the mold that includes the recessed surface.

The edges of the semiconductor chip are not rigidly constrained and are substantially free to slide inward on the recessed surface of the concave mold. The edges may slide inward while the semiconductor chip is pushed downward into the recessed surface during a process of bending the semiconductor chip. For example, bending the semiconductor chip to form a concave shaped semiconductor chip may be performed by applying a force on the semiconductor chip, toward the bottom of the concave mold. This force may be applied substantially uniformly across the area of the semiconductor chip. For example, a force applied across the area may have some variation but has a substantial uniformity so that the force uniformity is adequate to deform a semiconductor chip from being substantially flat to a desired curvature. While applying such a force, the semiconductor chip bends and the center of the semiconductor chip displaces downward. A fraction of the tension required to achieve a degree of center displacement may be reduced by permitting the edges of the semiconductor chip to slide inward on the recessed surface of the concave mold. As mentioned above, such sliding occurs because the edges are not physically constrained to maintain their position. As described in further detail below, an appropriate amount of friction, which may vary during a process of bending the semiconductor chip, exists between the edges of the semiconductor chip and the recessed surface of the concave mold. The friction provides control over the level of tension during the bending process and increases the elastic stability of the semiconductor chip, preventing out-of-plane buckling of the semiconductor chip (e.g., comprising relatively thin silicon) caused by in-plane compressive forces. Uncontrolled out-of-plane buckling may lead to wrinkles in the semiconductor chip and subsequent catastrophic failure if the chip exceeds its failure strains.

In various examples, the combination of a curved photonic sensor chip bonded to a mold that was used to shape the photonic sensor chip may comprise a stand-alone optical device that may be subsequently incorporated into optical systems. For example, a manufacturer may fabricate an optical device comprising the combination of a curved photonic sensor chip bonded to a substrate. The manufacturer may supply such an optical device to another manufacturer that produces optical systems. The optical device may be incorporated into such optical systems.

Various examples are described further with reference to FIGS. 1-16.

Example Environment

FIG. 1 is a top view of an example photonic sensor chip 100. Examples of techniques and apparatuses described herein may be applied to semiconductor chips and are not limited to bending photonic sensor chips. For illustrative purposes, however, examples and implementations described below involve photonic sensor chips. It should be noted that any of a number of other types of semiconductor chips may be shaped or bent using the example techniques and implementations.

Photonic sensor chip 100 includes a semiconductor substrate 102 upon which a light-sensitive portion 104 is built. Light-sensitive portion 104, which may be a CCD array, for example, includes one or more light-sensitive elements 106. Each such light-sensitive element 106, for example, may correspond to a pixel of an image produced, in part, by light-sensitive portion 104. Light-sensitive portion 104 may be referred to as an "active region", which is capable of converting light energy to electrical energy or electrical signals. Unless otherwise noted, the term "light" refers to electromagnetic energy in any portion of the spectrum. Thus, for example, light or light energy encompasses visible, infrared (IR), near-infrared (NIR), and ultraviolet (UV) portions of the electromagnetic spectrum.

An inactive region 108 may at least partially surround light-sensitive portion 104. Inactive region 108, which may be void (or substantially void) of light-sensitive elements, may include various circuit elements, conductive traces, and so on for operating light-sensitive portion 104. For example, if light-sensitive portion 104 is a CCD array, inactive region 108 may include circuitry for controlling rows and columns of the CCD elements. Each of light-sensitive portion 104 and inactive region 108 may occupy any portion of the area of photonic sensor chip 100. Light-sensitive portion 104 may, for example, be square or rectangular (or other shape) having any aspect ratio (e.g., width-to-height). Width 110 or length 112 of photonic sensor chip 100 may be in a range from about 5 millimeters up to about 35 millimeters, though claimed subject matter is not limited in this respect. In a particular example implementation, distances 114-118 from edges of light-sensitive portion 104 to edges of corners of semiconductor substrate 102 may be in a range from about 1% up to about 50% of width 110 or length 112. A portion of a mold surface 120 is illustrated to indicate that a corner 122 of flat photonic sensor chip 100 may be placed on the mold surface, while other portions of the photonic sensor chip are not in contact with the mold surface, as described below.

Semiconductor substrate 102 may comprise any number of elements, including combinations of such elements, any of which may include added impurities (e.g., dopants). For example, semiconductor substrate 102 may be silicon or germanium. In some examples, thickness of photonic sensor chip 100 may range from about 5 to 10 microns up to about 50 microns.

Photonic sensor chip 100, which may be flat or curved, may be incorporated into an optical system that provides light in a particular fashion to photonic sensor chip 100. For example, in some implementations, a lens system may be configured to have a focal plane that coincides with the location of photonic sensor chip 100. In a particular implementation, a lens system may be configured to have a focal surface that coincides with the curved surface of a curved version of photonic sensor chip 100. In other implementations, a lens system may be configured to have a focal length that coincides with the focal length of photonic sensor chip 100. Optical elements (e.g., lenses and/or mirrors) of the optical system may at least partially determine the location of a focal plane and a focal length. In particular, a portion of an optical system that provides light to light-sensitive portion 104 may be designed based, at least in part, on particular details of light-sensitive portion 104, such as the size of light-sensitive portion 104, the resolution of light-sensitive portion 104, and the positioning of light-sensitive portion 104 with respect to the remainder of the optical system. Performance of optical systems depends, at least in part, on the design of each of the optical elements of the optical system as well as the overall design of the optical system, which sets forth the optical interaction among the optical elements. For example, light output of one lens may be the light input of a subsequent lens. Generally, quality of the optical elements and their arrangement with respect to one another increases as resolution (e.g., density of light-sensitive elements 106, such as CCD elements that correspond to pixels) increases. For example, such quality may be based, at least in part, on parameters of the individual optical elements, including, but not limited to, structural and optical aberrations, optical transmission or reflection, light uniformity, positioning, and so on.

Figure 2:
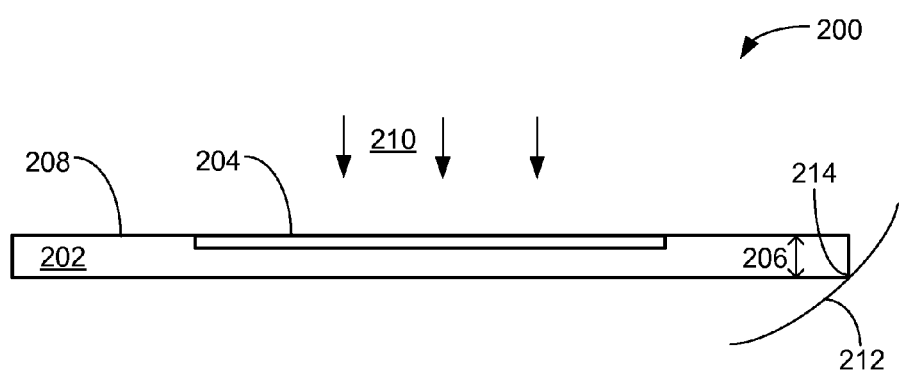
FIG. 2 is a cross-section view of an example photonic sensor chip.

FIG. 2 is a cross section view of an example photonic sensor chip 200. Photonic sensor chip 200 may be the same as or similar to photonic sensor chip 100, illustrated in FIG. 1. Photonic sensor chip 200 includes a semiconductor substrate 202 upon which an active region 204 is built. In some implementations, substrate 202 may have a thickness 206 ranging from about 5 to 10 microns up to about 50 microns.

Active region 204 includes one or more light-sensitive elements, such as 106 illustrated in FIG. 1. An inactive region 208 may at least partially surround active region 204. Inactive region 208, which may be void of light-sensitive elements, may include various circuit elements, conductive traces, and so on for operating active region 204. Each of active region 204 and inactive region 208 may occupy any portion of the area of photonic sensor chip 200. Photonic sensor chip 200 may be positioned or arranged to receive light 210 on at least a portion of active region 204. A portion of a mold surface 212 is illustrated to indicate that a corner 214 of flat photonic sensor chip 200 may be placed on the mold surface, while other portions of the photonic sensor chip are not in contact with the mold surface, as described below.

Figure 3:
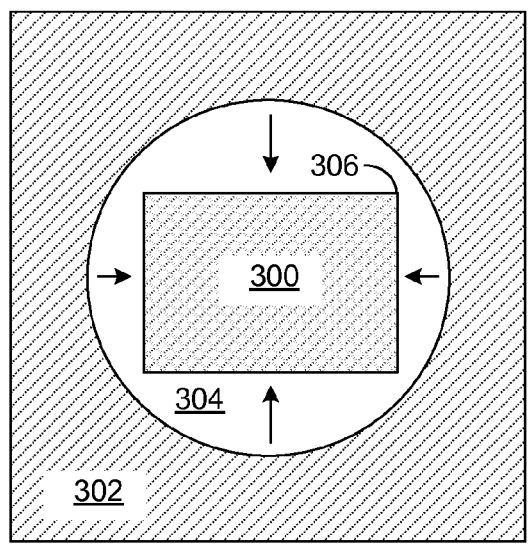
FIG. 3 is a top view of an example rectangular semiconductor chip in a concave mold.
Figure 4:
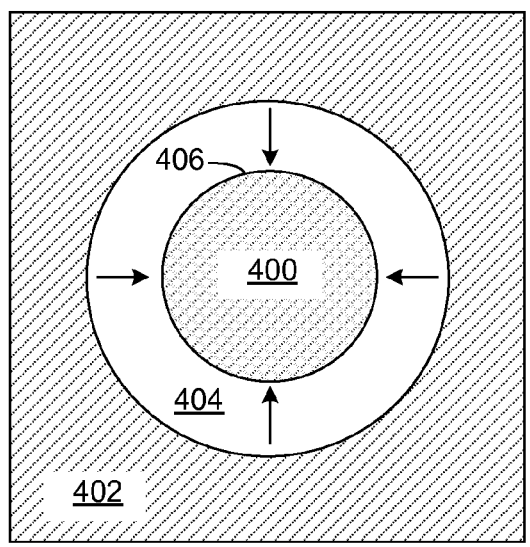
FIG. 4 is a top view of an example circular semiconductor chip in a concave mold.

FIGS. 3 and 4 illustrate examples of semiconductor chips, such as photonic sensor chips, placed on a recessed surface of a concave mold. Examples described herein involve concave molds having shapes that may be spherical, parabolic, aspheric, or a compound shape having one or more inflection points, just to name a few examples. FIG. 3 is a top view of a rectangular semiconductor chip 300 in a concave mold 302, and FIG. 4 is a top view of a circular semiconductor chip 400 in a concave mold 402, according to various examples. For example, concave mold 302 and concave mold 402 may be the same as or similar to one another, while semiconductor chips 300 and 400 differ by shape.

In FIG. 3, concave mold 302 includes a recessed surface 304 having a surface that slopes downward, as indicated by arrows in FIG. 3, toward a bottom of recessed surface 304. Due at least in part to geometry of a flat rectangle (e.g., semiconductor chip 300) in an ellipsoid or spherical surface (e.g., recessed surface 303), corners 306 of semiconductor chip 300 are the only portions of semiconductor chip 300 in contact with the surface of recessed surface 304.

In FIG. 4, concave mold 402 includes a recessed surface 404 having a surface that slopes downward, as indicated by arrows in FIG. 4, toward a bottom of recessed surface 404. Due at least in part to geometry of a flat circle (e.g., semiconductor chip 400) in an ellipsoid or spherical surface (e.g., recessed surface 404), edge 406, which is the perimeter of semiconductor chip 400, is the only portion of semiconductor chip 400 in contact with the surface of recessed surface 404.

Figure 5:
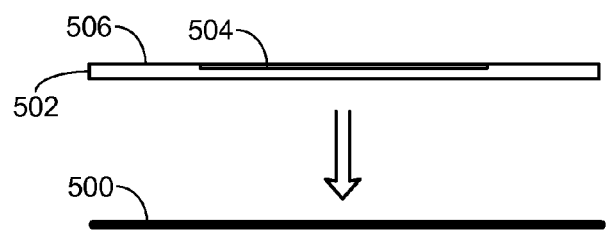
FIG. 5 illustrates a schematic representation of an example photonic sensor chip.

FIG. 5 illustrates a schematic representation 500 of an example photonic sensor chip 502 illustrated in a cross section view. For sake of clarity, FIGS. 6-13 illustrate a photonic sensor chip, such as 502, by schematic representation 500. In other words, photonic sensor chip 502, which may include an active region 504 and an inactive region 506, is illustrated in FIGS. 6-13 as a thick line or curve. It should also be noted that schematic representation 500 may represent any of a number of types of semiconductor chips, and is not limited to representing a photonic sensor chip.

Figure 6:
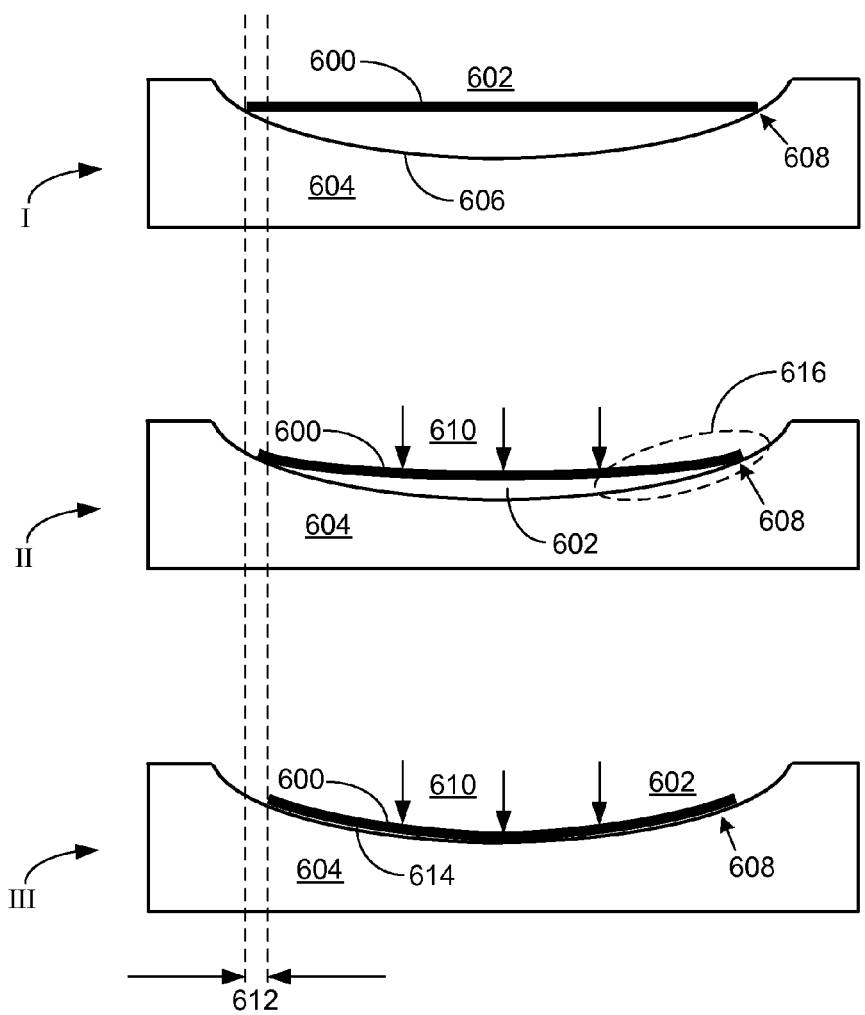
FIG. 6 includes cross-section views of an example semiconductor chip in a concave mold.

FIG. 6 includes cross-section views of an example semiconductor chip 600 in a recessed surface 602 of a concave mold 604. For example, concave mold 604 may be the same as or similar to concave mold 302 or 402, illustrated in FIGS. 3 and 4, respectively. In stage I, semiconductor chip 600 is flat. Edges of semiconductor chip 600 are in contact with surface 606 at contact regions 608. Remaining portions of semiconductor chip 600 are suspended above surface 606.

In stage II, a net force 610 is applied to semiconductor chip 600 to bend semiconductor chip 600. Any of a number of techniques may be used to apply force 610, some of which are described in detail below. Edges of semiconductor chip 600 remain in contact with surface 606 at contact regions 608, while semiconductor chip 600 bends as force 610 is applied.

In stage III, net force 610 continues to be applied to semiconductor chip 600 and semiconductor chip is further bent until its shape is substantially the same as surface 606 of the concave mold. Edges of semiconductor chip 600 remain in contact with surface 606 at contact regions 608, while semiconductor chip 600 bends as force 610 is applied. As semiconductor chip bends (e.g., from stage I to stage iii), the contact region moves and increases in area. In other words, as the semiconductor chip is bent downward, its edge slides downward along surface 606 while an increasing portion of the semiconductor chip comes into contact with surface 606 (as the semiconductor chip increasingly conforms to the shape of surface 606). In the case of a rectangular semiconductor chip in a concave mold having a circular or elliptical cross section, only corners of the rectangular semiconductor chip are in contact with surface 606 up to some stage of bending, after which all the edges (between the corners) of the semiconductor chip come into contact with surface 606. This occurs as the semiconductor chip increasingly conforms to the shape of surface 606. Movement of edges of semiconductor chip 600 is indicated by displacement 612, which compares the position of the edges in stage I with that of stage III.

In some implementations, an adhesive 614 may be located between semiconductor chip 600 and surface 606 to maintain the bent shape of semiconductor chip 600 so that force 610 may be discontinued.

A region 616 is indicated by a dashed oval. Close-up details of this region are described below.

Figure 7:
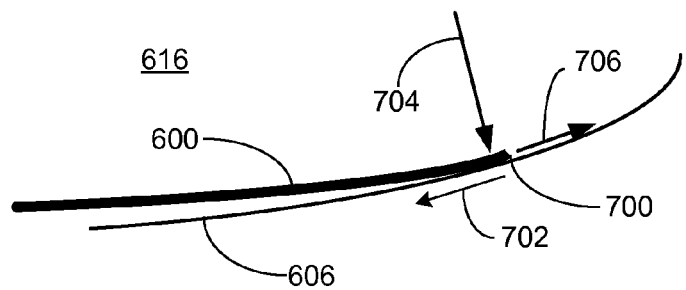
FIG. 7 is a close-up view of an edge or corner of an example semiconductor chip in contact with a surface of a concave mold.

FIG. 7 is a close-up view of region 616 an edge or corner of semiconductor chip 600, introduced in FIG. 6. The edge or corner 700 of semiconductor chip 600 is in contact with surface 606 of concave mold 604, according to a number of examples. As described above, edge 700 slides inward and/or downward along surface 606, as indicated by arrow 702, while an applied force bends semiconductor chip 600 downward. The applied force leads to a reaction force (not illustrated) on semiconductor chip 600 by surface 606 that in turn creates a normal force 704. A friction force 706, which results in part from a coefficient of friction between semiconductor chip 600 and surface 606, is proportional to normal force 704. Friction force 706 acts tangentially opposite to the direction of sliding (e.g., indicated by arrow 702) of edge or corner 700. In some implementations, concomitant with increasing bending, an increasing portion of semiconductor chip 600 comes into contact with surface 606 and friction force 706 increases.

Figure 8:
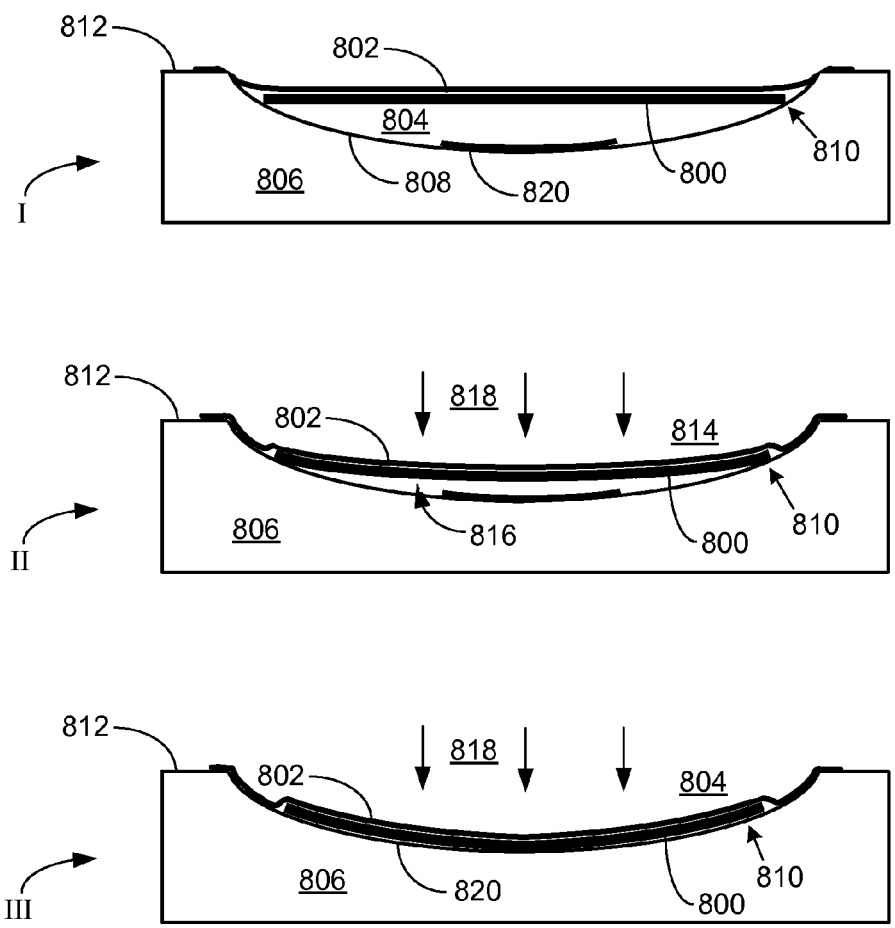
FIG. 8 includes cross-section views of an example semiconductor chip and a resilient film in a concave mold.

FIG. 8 includes cross-section views of a semiconductor chip 800 and a resilient film 802 on a recessed surface 804 of a concave mold 806, according to various examples. For example, concave mold 806 may be the same as or similar to concave mold 604, illustrated in FIG. 6. At least some of the details of the examples of FIG. 8 are similar to or the same as those of FIG. 6, with the addition of resilient film 802 in FIG. 8. As explained in detail below, resilient film 802 may be used to (i) create a substantially uniform pressure on semiconductor chip 800, (ii) provide a technique for adjusting friction levels between semiconductor chip 800 and surface 808 of recessed surface 804, (iii) provide physical stability to the semiconductor chip during bending to counter any tendency for the semiconductor chip to wrinkle or buckle, and (iv) act as a membrane to contain an elevated pressure (e.g., such an elevated pressure may arise by creating a vacuum in a neighboring region, as described below). Resilient film 802 may comprise any of a number of types of materials, such as biaxially-oriented polyethylene terephthalate (BoPET), Teflon, and Kapton, just to name a few examples. Qualitatively, candidate materials for resilient film 802 may be substantially resilient without being overly rubbery or stretchy, will not bond to semiconductor chip if contacted with some particular adhesives, and be able to maintain their properties at elevated temperatures, which may occur in thermal curing processes.

In stage I, semiconductor chip 800 is flat. Edges of semiconductor chip 800 are in contact with surface 808 at contact regions 810. Remaining portions of semiconductor chip 800 are suspended above surface 808. Resilient film 802 may be partially outside recessed surface 804 and on a periphery 812 of concave mold 806. In this configuration, resilient film 802 may act as a membrane to contain a pressure above resilient film 802 that is greater than a pressure below resilient film 802 and semiconductor chip 800. Such a situation is illustrated in stage II, wherein pressure in a volume 814 above resilient film 802 is greater than a pressure in a volume 816 below resilient film 802 and semiconductor chip 800. Such a pressure difference leads to a net pressure and force 818 that pushes and deflects semiconductor chip 800 into recessed surface 804 of concave mold 806. In some examples, to create a pressure difference, volume 814 may include ambient pressure while volume 816 is at least a partial vacuum. In various implementations, a pressure relief port (not illustrated) may be used to remove elevated and/or reduced pressure states in volumes 814 and 816, for example.

An adhesive 820, which may comprise a thermosetting epoxy, for example, may be placed on at least a portion of surface 808. In some implementations, throughout the deflection and bending process depicted in stages I and II, semiconductor chip 800 does not contact adhesive 820 until stage III, when semiconductor chip is substantially the same shape as surface 808 of concave mold 806. Subsequent to that event, space between semiconductor chip 800 and surface 808 is sufficiently small and narrow such that adhesive 820 may wick along this space (e.g., at least partially due to capillary action of the adhesive) and substantially cover surface 808 beneath semiconductor chip 800. Wicked adhesive 820, which is substantially uniform, may have a thickness in a range from about 0.5 microns up to about 1.0 micron, for example. In some implementations, the surface of semiconductor chip 800 and/or surface 808 may have a particular roughness or texture for a desired amount of wettability of adhesive 820 on these surfaces.

Subsequent to adhesive 820 being in contact with both semiconductor chip 800 and surface 808, the temperature of the adhesive (and adjacent semiconductor chip 800 and surface 808) may be raised to cure the adhesive. The pressure differential between volumes 814 and 816 may be maintained until the adhesive is cured. At this point, semiconductor chip 800 is adhered to surface 808 of mold 806. Alternatively, if the mold comprises a substantially transparent material, a light cured adhesive such as a UV adhesive, may be used to adhere the semiconductor chip.

Figure 9:
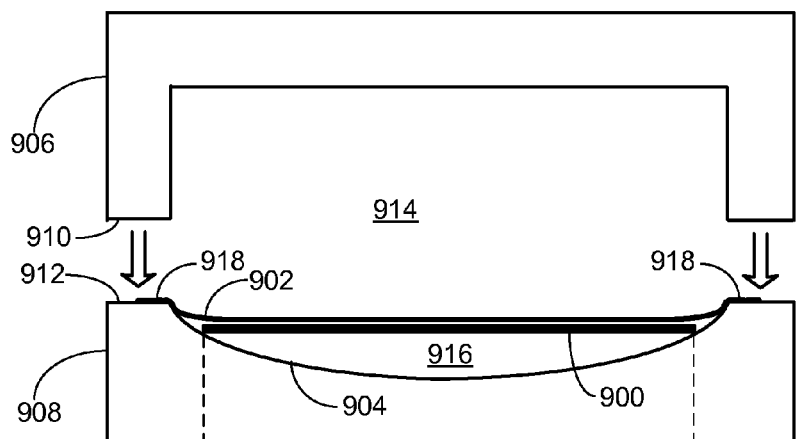
FIGS. 9-11 are cross-section views of an example semiconductor chip and a resilient film in a bending jig that includes a concave mold.
Figure 10:
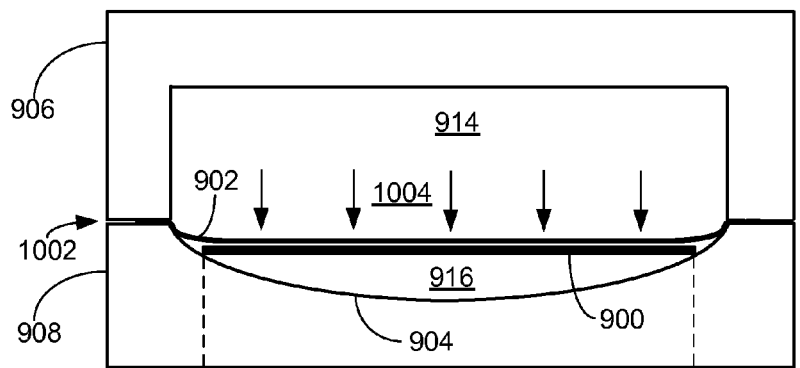
Figure 11:
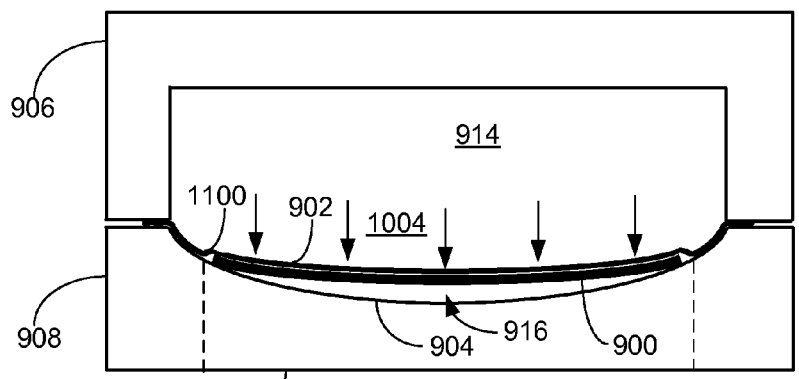

FIGS. 9-11 illustrate various portions of an example process of bending or shaping a semiconductor sensor chip, such as photonic sensor chip 100, according to some examples. Such a process may be performed by any entity, either manually (e.g., by human), automatically (e.g., by machine), or a combination thereof. Such an entity, which may, for example, be a manufacturer, assembler, fabricator, or builder is herein referred to as a "fabricator". Such a process may comprise batch processing, wherein a plurality (e.g., dozens, hundreds, or thousands) of semiconductor sensor chips may be shaped simultaneously.

FIG. 9 is a cross-section view of a semiconductor chip 900 and a resilient film 902 in a bending jig that includes a concave mold surface 904, according to various examples. For example, concave mold surface 904 may be the same as or similar to surface 808 of concave mold 806, and resilient film 902 may be the same as or similar to resilient film 802, illustrated in FIG. 8. For illustrative clarity, a slender gap between semiconductor chip 900 and film 902 is illustrated in FIG. 9, but such a gap does not actually exist. In other words, film 902 and semiconductor chip 900 are in contact with one another.

The bending jig may comprise an upper portion 906 and a lower portion 908, which includes concave mold surface 904. Upper portion 906 and lower portion 908 are configured to be joined together during a process of bending semiconductor chip 900 and may be mechanically aligned with one another by pins (not illustrated) that at least partially control vertical motion, which is indicated by the arrows in FIG. 9. In this fashion, for example, interface surface 910 of upper portion 906 and interface surface 912 of lower portion 908 may be joined (e.g., clamped) together, forming a volume 914. In some examples, subsequent to a bending process, lower portion 908 may be removed from the bending jig to be a permanent part of a shaped (bent) semiconductor chip after being adhered to the semiconductor chip.

When upper portion 906 and lower portion 908 are joined, volume 914 may be pressurized to have a pressure greater than surrounding areas, as described below.

While upper portion 906 and lower portion 908 of the bending jig are separated, a fabricator may place an adhesive on at least a portion of concave mold surface 904 and place semiconductor chip 900 in the recess formed by concave mold surface 904. In the case where the semiconductor chip is rectangular, the corners of the semiconductor chip are the only portions of the semiconductor chip in physical contact with concave mold surface 904. In the case where the semiconductor chip is circular, the edge (e.g., perimeter) of the semiconductor chip is the only portion of the semiconductor chip in physical contact with concave mold surface 904. Accordingly, semiconductor chip 900 is suspended over and substantially covers the recessed surface of the concave mold, while the corners or edge(s) of the semiconductor chip rest on the recessed surface. Moreover, corners or edge(s) of the semiconductor chip are free to slide on concave mold surface 904.

A fabricator may place resilient film 902 on semiconductor chip 900 to cover the semiconductor chip and at least a portion of interface surface 912. Placement of resilient film 902 creates a volume between resilient film 902 (and semiconductor chip 900) and concave mold surface 904 that is substantially closed. When upper portion 906 and lower portion 908 of the bending jig are joined, interface surface 910 and interface surface 912 clamp onto an edge region 918 of resilient film 902, leading to a fluid-tight seal (e.g., for a fluid, liquid, or gas).

In some examples, lower portion 908 of the bending jig may comprise a concave mold portion 920 that is removable from lower portion 908. Vertical dashed lines indicate an example interface where concave mold portion 920 may be removed from lower portion 908. In this case, concave mold portion 920 can become a permanent part of a shaped semiconductor chip 900 by adhering the semiconductor chip and the concave mold portion together after the bending process, as described below.

In FIG. 10, the fabricator may join upper portion 906 and lower portion 908 of the bending jig together, tightly clamping edge region 918 of resilient film 902, and forming a seal 1002. Accordingly, volumes 914 and 916 may be pressurized (or depressurized to form at least a partial vacuum) independently of one another. The fabricator may adjust the pressures of volumes 914 and/or 916 so that the pressure of volume 914 is greater than that of volume 916. Such a pressure differential condition leads to a substantially uniform force 1004 on film 902, and in turn, semiconductor chip 900. Force 1004 bends semiconductor chip 900 downward into the concave mold. (In various implementations, one or more pressure relief ports (not illustrated) may be used to remove elevated and/or reduced pressure states in volumes 914 and 916, for example.)

In FIG. 11, the fabricator maintains the pressure differential that leads to force 1004. Thus, as force 1004 continues to be applied to semiconductor chip 900, the semiconductor chip is bent until its shape is substantially the same as concave mold surface 904. Edges of semiconductor chip 900 remain in contact with concave mold surface 904 while semiconductor chip 900 bends as force 1004 is applied. As the semiconductor chip bends, the contact region between concave mold surface 904 and the edges of semiconductor chip 900 moves and increases in area. In other words, as the semiconductor chip is bent downward, its edge slides downward along surface 904 while an increasing portion of the semiconductor chip comes into contact with surface 904 (as the semiconductor chip increasingly conforms to the shape of surface 904). This increasing contact area leads to an increasing friction force as the semiconductor chip is bent into the concave mold.

In some examples, force 1004 pushes film 902 against semiconductor chip 900 to squeeze semiconductor chip 900 between film 902 and surface 904. A friction coefficient between film 902 and semiconductor chip 900 leads to a frictional force, in addition to the frictional force between semiconductor chip 900 and surface 904. As semiconductor chip 900 bends under force 1004, the semiconductor chip stores mechanical energy, leading to stresses that can fracture the semiconductor chip during the bending process. For example, tension may be greatest at an apex of a bent semiconductor chip. Also, bending may lead to compression in radial and circumferential directions. Tensions and compressions correspond to stresses that determine, at least in part, if the semiconductor chip fractures. Also, amount and distribution of such stresses are determined, at least in part, by frictional forces that force 1004 imposes on the semiconductor chip, across the area of the semiconductor chip and at the edges of the semiconductor chip. Depending, at least in part, on the shape and characteristics of the semiconductor chip, the concave mold shape, and rate of bending of the semiconductor chip, a particular range of frictional forces may be desirable to significantly reduce or minimize likelihood of semiconductor chip fracture during bending. For example, such a particular range of frictional forces may provide a desirable amount of physical stability during the bending process. Absence of physical stability may, for example, lead to undesirable wrinkling or buckling of the semiconductor chip. (A rectangular semiconductor chip may have a tendency to wrinkle as it is pushed into a circular mold). Accordingly, the fabricator may a priori adjust the amount of frictional force by designing or selecting particular materials for (or by applying surface treatments to) film 902.

In some implementations, the elevated pressure in volume 914 (with respect to the pressure of volume 916) pushes film 902 tightly against surface 904 at the edge or corners of semiconductor chip 900. Film 902 conforms to the edge or corners of the semiconductor chip, forming an "edge conformity" 1100, that may provide positional stability to semiconductor chip 900 during the bending process. As the bending process increasingly deflects semiconductor chip 900, edge conformity 1100 follows the edge or corners of the semiconductor chip as the edge or corners slide downward on surface 904.

In some implementations, force 1004 may be replaced by a type of non-uniform force that is applied across the area of semiconductor chip 900 by pressing on the chip with a forming tool (e.g., stamp) having non-uniform density or resilience. For example, pressure on semiconductor chip 900 may be applied by a forming tool having a particular shape and comprising a material having particular compliance/rigidity such that the pressure is applied over the area of the semiconductor chip in a favorably gradual and controlled manner. Applying such a forming tool may allow semiconductor chip 900 to undergo displacement corresponding to a forming-shaping process. A forming tool having a higher radius of curvature than that of surface 904 may be pushed onto semiconductor chip 900. The center portion of the forming tool may be softer (e.g., resilient) than at the edges of the forming tool. This may allow for a relatively slow buildup of pressure applied to semiconductor chip 900 as the forming tool is pushed against (e.g., lowered onto) the semiconductor chip.

Figure 12:
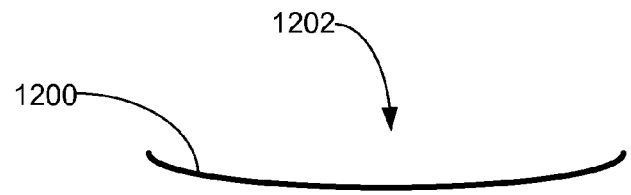
FIGS. 12 and 13 are cross-section views of example semiconductor chips.
Figure 13:
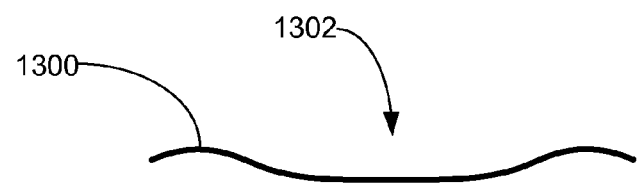

FIGS. 12 and 13 are cross-section views of curved photonic sensor chips, according to various examples. In FIG. 12, a light-sensitive portion 1200 of a curved photonic sensor chip 1202 has a spherical or aspheric shape. Such a shape has no inflection points. Light-sensitive portion 1200 is concave. On the other hand, as illustrated in FIG. 13, a light-sensitive portion 1300 of a curved photonic sensor chip 1302 has a complex shape that includes one or more inflection points. Portions of light-sensitive portion 1300 may include spherical or aspheric shapes. Such complex shapes may be useful in a number of optical systems. Bending processes, such as those described above, may be used to produce simple or complex shapes, such as the shapes of photonic sensor chips 1202 and 1302, for example.

Figure 14:
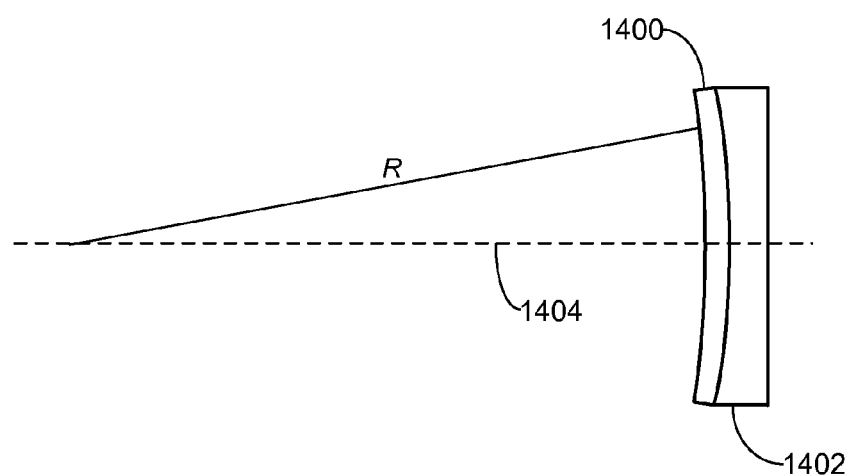
FIG. 14 is a cross-section view of an example curved photonic sensor chip and a substrate.

FIG. 14 is a cross-section view of a curved photonic sensor chip 1400 and a substrate 1402, according to various examples. For example, photonic sensor chip 1400 may be the same as or similar to semiconductor chip 900 subsequent to a bending process described above. In some implementations, substrate 1402 may be the same as or similar to concave mold portion 920, removed from lower portion 908 of the bending jig illustrated in FIGS. 9-11. In other implementations, substrate 1402 may be the same as or similar to lower portion 908 of the bending jig.

The combination of a curved photonic sensor chip bonded to a substrate may comprise a stand-alone optical device that may be subsequently incorporated into optical systems. An optical axis 1404 of such optical systems is shown in relation to photonic sensor chip 1400. A focal length of photonic sensor chip 1400, which is based, at least in part, on the curved shape of photonic sensor chip 1400, may be a significant factor when photonic sensor chip 1400 is incorporated in an optical system. When the shape of photonic sensor chip 1400 is substantially spherical, the focal length of photonic sensor chip 1400 may be at least approximately equal to the inverse of the radius of curvature R of photonic sensor chip 1400. If photonic sensor chip 1400 has an aspheric shape, then the radius of curvature of photonic sensor chip 1400 changes with distance from optical axis 1404. An optical system that incorporates photonic sensor chip 1400 may be designed to accommodate such a variable radius of curvature.

Figure 15:
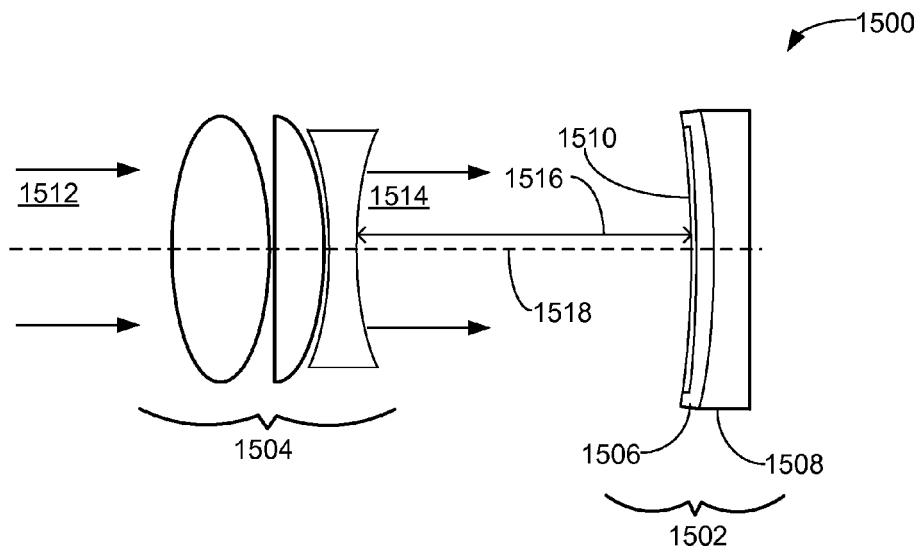
FIG. 15 is a cross-section view of an example optical system that includes a curved photonic sensor chip and a substrate.

FIG. 15 is a cross-section view of an optical system 1500 that includes a curved photonic sensor module 1502 and a lens assembly 1504, according to various examples. In particular, photonic sensor module 1502 comprises a curved photonic sensor chip 1506 and a substrate 1508. Curved photonic sensor chip 1506 includes a light-sensitive portion 1510. Curved photonic sensor chip 1506 and substrate 1508 may be similar to or the same as curved semiconductor chip 900 and lower portion 908 illustrated in FIG. 9, respectively. In some implementations, substrate 1508 may be sufficiently rigid to maintain the curved shape of curved photonic sensor chip 1506.

Curved photonic sensor chip 1506 (or light-sensitive portion 1510) may have a shape that gives rise to a focal length. Such a focal length may be considered when placing photonic sensor module 1502 in optical system 1500. In particular, lens assembly 1504 may be designed to receive light 1512, optically operate on the light, and produce light output 1514 that focuses an image onto curved photonic sensor chip 1506, which may be a distance 1516 from lens assembly 1504. Distance 1516 may be at least approximately equal to a focal length of curved photonic sensor chip 1506. In some implementations, an inverse of the focal length of curved photonic sensor chip 1506 is at least approximately equal to the radius of curvature of curved photonic sensor chip 1506. Lens assembly 1504 and photonic sensor module 1502 may be aligned along an optical axis 1518.

Figure 16:
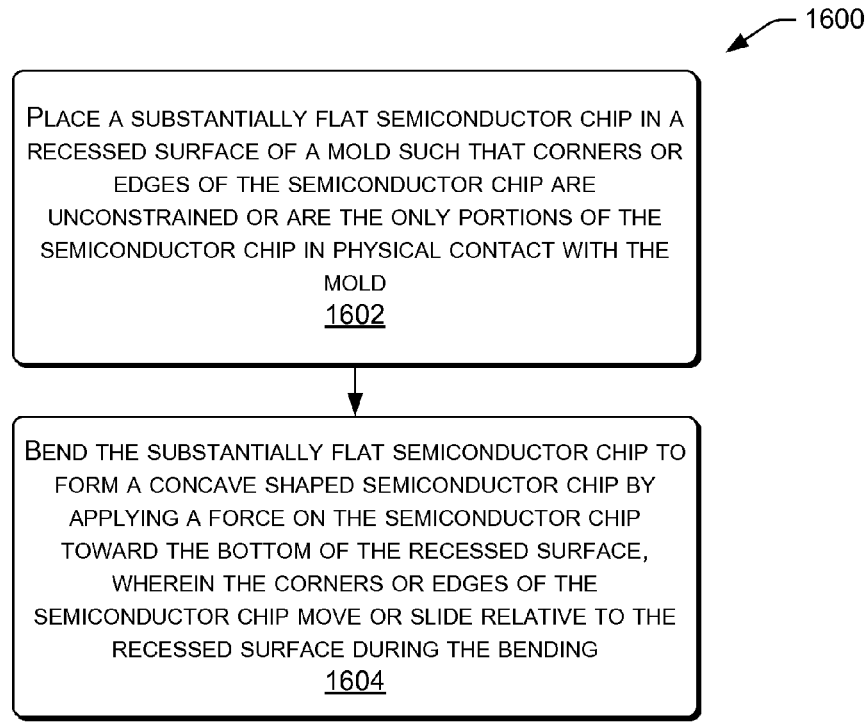
FIG. 16 is a flow diagram illustrating example processes for bending a semiconductor chip.

FIG. 16 is a flow diagram illustrating a process 1600 for bending a semiconductor chip, according to some examples. For example, such a semiconductor chip may be the same as or similar to photonic sensor chip 900 shown in FIG. 9. Process 1600 may be similar to or the same as at least a portion of the process depicted in FIGS. 9-11 and may be performed by a fabricator. A fabricator may provide a concave mold (e.g., or at least partially concave) to use in process 1600. Such a mold may include a recessed surface and a bottom of the recessed surface. For example, in the case of the mold being spherical and the recessed surface having the shape of a hemisphere, the bottom of the recessed surface is the apex of the hemisphere.

At block 1602, the fabricator may place a substantially flat semiconductor chip in the recessed surface of the mold such that edges of the semiconductor chip are substantially unconstrained and, in some implementations, are the only portions of the semiconductor chip in physical contact with the mold. For example, in the case where the semiconductor chip is rectangular and the recessed surface has a circular or elliptical cross section, the corners of the semiconductor chip are the only portions of the semiconductor chip in physical contact with the mold. In the case where the semiconductor chip is circular and the recessed surface has a circular cross section, the edge (e.g., perimeter) of the semiconductor chip is the only portion of the semiconductor chip in physical contact with the mold. In some implementations, the semiconductor chip comprises a photonic sensor chip.

At block 1604, the fabricator may bend the substantially flat semiconductor chip to form a concave shaped semiconductor chip by applying a force on the semiconductor chip toward the bottom of the recessed surface. In some implementations, the force on the semiconductor chip is applied substantially uniformly across the area of the semiconductor chip. During such bending, the edges of the semiconductor chip move or slide relative to the recessed surface.

Example Clauses

A. A method comprising: placing a substantially flat semiconductor chip on a recessed surface of a mold such that corners or edges of the semiconductor chip are substantially unconstrained; and bending the substantially flat semiconductor chip to form a concave shaped semiconductor chip by applying a force on the semiconductor chip toward a bottom of the recessed surface, wherein the substantially unconstrained corners or edges of the semiconductor chip move with respect to the recessed surface during the bending.

B. The method as paragraph A recites, further comprising: prior to the bending, placing a resilient film to cover (i) the substantially flat semiconductor chip and (ii) the recessed surface of the mold, wherein the resilient film is substantially fluid-impermeable.

C. The method as paragraph B recites, wherein bending the substantially flat semiconductor chip further comprises: setting gas pressure of a volume above the resilient film to be greater than a gas pressure of a volume below the resilient film and the substantially flat semiconductor chip.

D. The method as paragraph B recites, wherein the resilient film comprises biaxially-oriented polyethylene terephthalate (BoPET).

E. The method as paragraph A recites, further comprising: prior to bending the substantially flat semiconductor chip, placing an adhesive on the bottom of the recessed surface, wherein the semiconductor chip is not in contact with the adhesive until the semiconductor chip has a shape that substantially corresponds to the shape of the recessed surface of the mold.

F. The method as paragraph A recites, wherein the semiconductor chip comprises a photonic sensor chip.

G. The method as paragraph A recites, wherein the force on the semiconductor chip is substantially uniform across the area of the semiconductor chip.

H. The method as paragraph A recites, wherein the substantially flat semiconductor chip is rectangular and the recessed surface of the mold has a circular or elliptical cross-section.

I. The method as paragraph A recites, wherein placing the substantially flat semiconductor chip on the recessed surface of the mold further comprises placing the substantially flat semiconductor chip on the recessed surface of the mold such that corners or edges of the semiconductor chip are the only portions of the semiconductor chip in physical contact with the mold.

J. A method comprising: arranging a resilient film to be adjacent to a substantially flat semiconductor chip; placing the resilient film and the substantially flat semiconductor chip in a bending jig to create (i) a first volume below the resilient film and the substantially flat semiconductor chip and (ii) a second volume above the resilient film and the substantially flat semiconductor chip, wherein the first volume includes a concave surface; and adjusting pressures of the first volume and/or the second volume so that pressure of the second volume is greater than pressure of the first volume such that (i) the resilient film and the substantially flat semiconductor chip bend toward the concave surface to produce a curved semiconductor chip, and (ii) the edges or corners of the flexing semiconductor chip move relative to the concave surface.

K. The method as paragraph J recites, wherein the edges or corners of the flexing semiconductor chip slide on the surface of the concave surface against a frictional force based, at least in part, on a normal force exerted by the resilient film on the bending semiconductor chip.

L. The method as paragraph K recites, wherein the frictional force is further based, at least in part, on a difference between the pressure of the second volume and the pressure of the first volume.

M. The method as paragraph K recites, wherein the frictional force increases as a greater portion of the flexing semiconductor chip contacts the surface of the concave surface.

N. The method as paragraph J recites, further comprising: placing an adhesive in the first volume, wherein the adhesive comprises a material that will not bond to the resilient film.

O. The method as paragraph N recites, further comprising: curing the adhesive to bond the curved semiconductor chip to the concave surface; and removing the curved semiconductor chip bonded to the concave surface from the bending jig.

P. An assembly comprising: a resilient film on a semiconductor chip, wherein:

the resilient film and the semiconductor chip are arranged in a jig so as to create (i) a first volume below the resilient film and the semiconductor chip and (ii) a second volume above the resilient film and the semiconductor chip, the first volume includes a substantially concave surface, edges or corners of the semiconductor chip (i) are the only portions of the semiconductor chip in contact with the substantially concave surface and (ii) are in slideable contact with the substantially concave surface, and the second volume is configured to have a pressure greater than a pressure of the first volume such that the resilient film and the semiconductor chip are flexed toward the substantially concave surface in response to the pressure of the second volume being greater than the pressure of the first volume.

Q. The assembly as paragraph P recites, wherein the edges or corners of the semiconductor chip are slideably positioned between the substantially concave surface and the resilient film with a predetermined friction.

R. The assembly as paragraph P recites, wherein the resilient film comprises a pressure bagging film.

S. The assembly as paragraph P recites, wherein the semiconductor chip comprises a photonic sensor chip.

T. The assembly as paragraph P recites, wherein the semiconductor chip is rectangular and the first volume has a circular or elliptical cross-section.

Conclusion

Although the subject matter has been described in language specific to structural features and/or methodological acts, it is to be understood that the subject matter defined in the appended claims is not necessarily limited to the specific features or acts described. Rather, the specific features and steps are disclosed as example forms of implementing the claims.

All of the methods and processes described above may be embodied in, and fully automated via, software code modules executed by one or more general purpose computers or processors. The code modules may be stored in any type of computer-readable medium, computer storage medium, or other computer storage device. Some or all of the methods may alternatively be embodied in specialized computer hardware such as, for example, a quantum computer or quantum annealer.

Conditional language such as, among others, "can," "could," "may" or "might" unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or a combination thereof.

Any routine descriptions, elements or blocks in the flow diagrams described herein and/or depicted in the attached figures should be understood as potentially representing modules, segments, or portions of code that include one or more executable instructions for implementing specific logical functions or elements in the routine. Alternate implementations are included within the scope of the examples described herein in which elements or functions may be deleted, or executed out of order from that shown or discussed, including substantially synchronously or in reverse order, depending on the functionality involved as would be understood by those skilled in the art.

It should be emphasized that many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
   placing a substantially flat semiconductor chip directly on a recessed surface of a mold such that corners or edges of the semiconductor chip are in contact with the mold and are substantially unconstrained;
   after placing the substantially flat semiconductor chip directly on the recessed surface of the mold, placing a non-bonding resilient film atop (i) the substantially flat semiconductor chip and (ii) the recessed surface of the mold such that the non-bonding resilient film is in contact with the mold, wherein the non-bonding resilient film is substantially fluid-impermeable; and
   after placing the non-bonding resilient film, bending the substantially flat semiconductor chip to form a concave shaped semiconductor chip by applying a force on the semiconductor chip toward a bottom of the recessed surface, wherein the substantially unconstrained corners or edges of the semiconductor chip move with respect to the recessed surface during the bending.

2. The method of claim 1, wherein the non-bonding resilient film extends beyond the corners or the edges of the substantially flat semiconductor chip.

3. The method of claim 1, wherein bending the substantially flat semiconductor chip further comprises:
   setting a gas pressure of a volume above the non-bonding resilient film to be greater than a gas pressure of a volume below the non-bonding resilient film and the substantially flat semiconductor chip.

4. The method of claim 1, wherein the non-bonding resilient film comprises biaxially-oriented polyethylene terephthalate (BoPET).

5. The method of claim 1, further comprising:
   prior to bending the substantially flat semiconductor chip, placing an adhesive on the bottom of the recessed surface, wherein the semiconductor chip is not in contact with the adhesive until the semiconductor chip has a shape that substantially corresponds to a shape of the recessed surface of the mold.

6. The method of claim 1, wherein the semiconductor chip comprises a photonic sensor chip.

7. The method of claim 1, wherein the force on the semiconductor chip is substantially uniform across an area of the semiconductor chip.

8. The method of claim 1, wherein the substantially flat semiconductor chip is rectangular and the recessed surface of the mold has a circular or elliptical cross-section.

9. The method of claim 1, wherein placing the substantially flat semiconductor chip on the recessed surface of the mold further comprises placing the substantially flat semiconductor chip on the recessed surface of the mold such that corners or edges of the semiconductor chip are the only portions of the semiconductor chip in physical contact with the mold.

10. A method comprising:
    arranging a non-bonding resilient film to be adjacent to a substantially flat semiconductor chip;
    placing the non-bonding resilient film and the substantially flat semiconductor chip directly on a recessed surface of a bending jig such that the non-bonding resilient film contacts the bending jig and creates (i) a first region below the non-bonding resilient film and the substantially flat semiconductor chip and (ii) a second region above the non-bonding resilient film and the substantially flat semiconductor chip, wherein the first region includes a concave surface; and
    adjusting pressures of the first region and/or the second region so that pressure of the second region is greater than pressure of the first region such that (i) the non-bonding resilient film and the substantially flat semiconductor chip bend toward the concave surface to produce a curved semiconductor chip, and (ii) edges or corners of the semiconductor chip move relative to the concave surface.

11. The method of claim 10, wherein the edges or the corners of the semiconductor chip slide on the concave surface against a frictional force based, at least in part, on a normal force exerted by the non-bonding resilient film on the bending semiconductor chip.

12. The method of claim 11, wherein the frictional force is further based, at least in part, on a difference between the pressure of the second region and the pressure of the first region.

13. The method of claim 11, wherein the frictional force increases as a greater portion of the semiconductor chip contacts the concave surface.

14. The method of claim 10, further comprising:
    placing an adhesive in the first region, wherein the adhesive comprises a material that will not bond to the non-bonding resilient film.

15. The method of claim 14, further comprising:
    curing the adhesive to bond the curved semiconductor chip to the concave surface; and
    removing the curved semiconductor chip bonded to the concave surface from the bending jig.

* * * * *